(12) United States Patent
Bal et al.

(10) Patent No.: US 11,989,148 B2
(45) Date of Patent: May 21, 2024

(54) DATA BRIDGE FOR INTERFACING SOURCE SYNCHRONOUS DATAPATHS WITH UNKNOWN CLOCK PHASES

(71) Applicant: STMicroelectronics International N.V., Geneva (CH)

(72) Inventors: Ankur Bal, Greater Noida (IN); Rupesh Singh, Ghaziabad (IN)

(73) Assignee: STMicroelectronics International N.V., Geneva (CH)

( * ) Notice: Subject to any disclaimer, the term of this patent is extended or adjusted under 35 U.S.C. 154(b) by 39 days.

(21) Appl. No.: 17/548,101

(22) Filed: Dec. 10, 2021

(65) Prior Publication Data
US 2022/0206987 A1 Jun. 30, 2022

Related U.S. Application Data

(60) Provisional application No. 63/132,297, filed on Dec. 30, 2020.

(51) Int. Cl.
*G06F 13/42* (2006.01)
*G06F 1/06* (2006.01)
*G06F 1/08* (2006.01)
*H03K 3/037* (2006.01)

(52) U.S. Cl.
CPC .......... *G06F 13/42* (2013.01); *G06F 1/06* (2013.01); *G06F 1/08* (2013.01); *H03K 3/037* (2013.01)

(58) Field of Classification Search
CPC ........ G06F 13/43; G06F 13/4068; G06F 1/06; G06F 1/08; G06F 1/10; G06F 1/12; G06F 2213/0038
See application file for complete search history.

(56) References Cited

U.S. PATENT DOCUMENTS

| | | | |
|---|---|---|---|
| 5,781,049 A | 7/1998 | Fugo | |
| 6,664,802 B2 | 12/2003 | Wimmer et al. | |
| 6,864,722 B2* | 3/2005 | Adkisson | G06F 1/12 327/12 |
| 7,221,126 B1 | 5/2007 | Williamson et al. | |
| 7,702,945 B2 | 4/2010 | Shibayama et al. | |
| 7,936,637 B2 | 5/2011 | Shori | |
| 8,103,897 B2 | 1/2012 | Endo et al. | |

(Continued)

FOREIGN PATENT DOCUMENTS

| | | |
|---|---|---|
| CN | 104639118 A | 5/2015 |
| CN | 107733428 A | 2/2018 |

(Continued)

OTHER PUBLICATIONS

U.S. Appl. No. 18/165,855, filed Feb. 7, 2023.

*Primary Examiner* — Raymond N Phan
(74) *Attorney, Agent, or Firm* — Seed IP Law Group LLP

(57) ABSTRACT

An integrated circuit includes a first subsystem including a first clock generator configured to generate a first clock signal. The integrated circuit also includes a second subsystem including a second clock generator configured to generate a second clock signal. The first subsystem include a clock edge selector configured to determine a phase difference between the first clock signal and the second clock signal and to select, based on the phase difference, either a rising edge or a falling edge of the second clock signal to control output of data from the first subsystem to the second subsystem.

16 Claims, 6 Drawing Sheets

(56) References Cited

U.S. PATENT DOCUMENTS

| | | |
|---|---|---|
| 8,418,092 B2 | 4/2013 | Basto et al. |
| 8,804,887 B2 | 8/2014 | Uehara |
| 9,479,182 B1 | 10/2016 | Baidas et al. |
| 10,116,315 B1 | 10/2018 | Zhuang et al. |
| 10,164,758 B2 | 12/2018 | Yang et al. |
| 2003/0174003 A1 | 9/2003 | Nogami |
| 2004/0170200 A1* | 9/2004 | Radjassamy .......... H04L 7/0008 370/518 |
| 2009/0174445 A1* | 7/2009 | Kim .................... G11C 7/22 327/153 |
| 2015/0015314 A1 | 1/2015 | Dally |
| 2018/0152279 A1* | 5/2018 | Yang .................... H04L 7/0045 |
| 2023/0259158 A1 | 8/2023 | Bal et al. |

FOREIGN PATENT DOCUMENTS

| | | |
|---|---|---|
| CN | 108292923 A | 7/2018 |
| CN | 109217951 A | 1/2019 |
| CN | 110661525 A | 1/2020 |
| CN | 105322956 B | 3/2020 |
| WO | 2017142665 A1 | 8/2017 |

* cited by examiner

DATA BRIDGE FOR INTERFACING SOURCE SYNCHRONOUS DATAPATHS WITH UNKNOWN CLOCK PHASES

BACKGROUND

Technical Field

The present disclosure is related to integrated circuits, and more particularly, to communication between subsystems of integrated circuits.

Description of the Related Art

A system on-chip (SoC) includes a plurality of subsystems implemented in a single integrated circuit. In some cases, one subsystem of the SoC is configured to provide data to the second subsystem of the SoC. It can be difficult to manage such communication efficiently.

FIG. 1 illustrates an example of an integrated circuit 100. The integrated circuit 100 is an SoC. The integrated circuit 100 includes a first subsystem 102 and a second subsystem 104. The first subsystem 102 is configured to output data to the second subsystem 104. The first subsystem 102 operates on a first clock signal CLK1. The second subsystem 104 operates on a second clock signal CLK2.

There are various complications that affect the timing of communication between the first and second subsystems 102 and 104. For example, there may be certain delays in processing and transmitting data from the first subsystem 104 and certain other delays in processing and receiving data in the second subsystem 104. Additionally, the first and second clock signals may be out of phase with each other to an unknown degree. These factors make it difficult to reliably transmit data from the first subsystem 102 in accordance with the first clock signal CLK1 and to receive data at the second subsystem on a desired cycle of the second clock signal. If this is not managed properly, then there can be delays and even failures in data reception by the second subsystem 104.

One possible solution to ensure safe transmission of data from the first subsystem 102 to the second subsystem 104 is to couple a first-in first-out (FIFO) buffer 106 between the first and second subsystems 102 and 104. The FIFO buffer 106 receives the first clock signal CLK1 from the first subsystem 102 and the second clock signal CLK2 from the second subsystem 104. The FIFO buffer 106 utilizes the first clock signal CLK1 to manage reception of data from the first subsystem 102. The FIFO 106 utilizes the second clock signal CLK2 to manage outputting data to the second subsystem 104.

While this solution ensures safe transmission of data between the first subsystem 102 and the second subsystem 104, there are some drawbacks. For example, the FIFO 106 consumes a relatively large amount of area on the integrated circuit. Furthermore, the FIFO 106 consumes a significant amount of power.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventor's approach to the particular problem, which, in and of itself, may also be inventive.

BRIEF SUMMARY

Embodiments of the present disclosure provide a system on-chip with subsystems that can communicate with each other without intervening circuits, aside from signal lines, conductive plugs, and other passive electrical connectors. This is accomplished by detecting phase differences between the clock signals of a transmitting subsystem and a receiving subsystem. Embodiments of the present disclosure select whether data will be transmitted from the transmitting subsystem on a rising edge or a falling edge of a clock signal based on the detected phase difference between the clock signals of the two communicating subsystems.

In one embodiment, a first subsystem transmits data to a second subsystem. The first subsystem generates a first clock signal. The second subsystem generates a second clock signal. The first subsystem receives the second clock signal from the second subsystem. The first subsystem determines a phase difference between the first and second clock signals. The first subsystem selectively transmits data to the second subsystem on either the rising edge of the second clock signal or on the falling edge of the second clock signal depending on the detected phase difference between the first and second clock signals.

In one embodiment, the first subsystem generates a first phase signal and a second phase signal from the first clock signal. The first and second phase signals have the same frequency as the first clock signal butter each out of phase with the first clock signal to a selected extent. The rising edge of the first phase signal occurs a selected amount of time before the rising edge of the first clock signal. The rising edge of the second phase signal occurs a selected amount of time after the rising edge of the first clock signal. The rising edges of the first and second phase signals define an edge detection window. The first subsystem detects whether an edge of the second clock signal occurs within the detection window. The first subsystem selects either the rising edge or the falling edge of the second clock signal for data transmission based on whether an edge of the second clock signal occurs within the detection window defined by the first and second phase signals.

BRIEF DESCRIPTION OF THE SEVERAL VIEWS OF THE DRAWINGS

Reference will now be made by way of example only to the accompanying drawings. In the drawings, identical reference numbers identify similar elements or acts. In some drawings, however, different reference numbers may be used to indicate the same or similar elements. The sizes and relative positions of elements in the drawings are not necessarily drawn to scale. For example, the shapes of various elements and angles are not necessarily drawn to scale, and some of these elements may be enlarged and positioned to improve drawing legibility.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known systems, components, and circuitry associated with integrated circuits have not been shown or described in detail, to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

Figure 1:
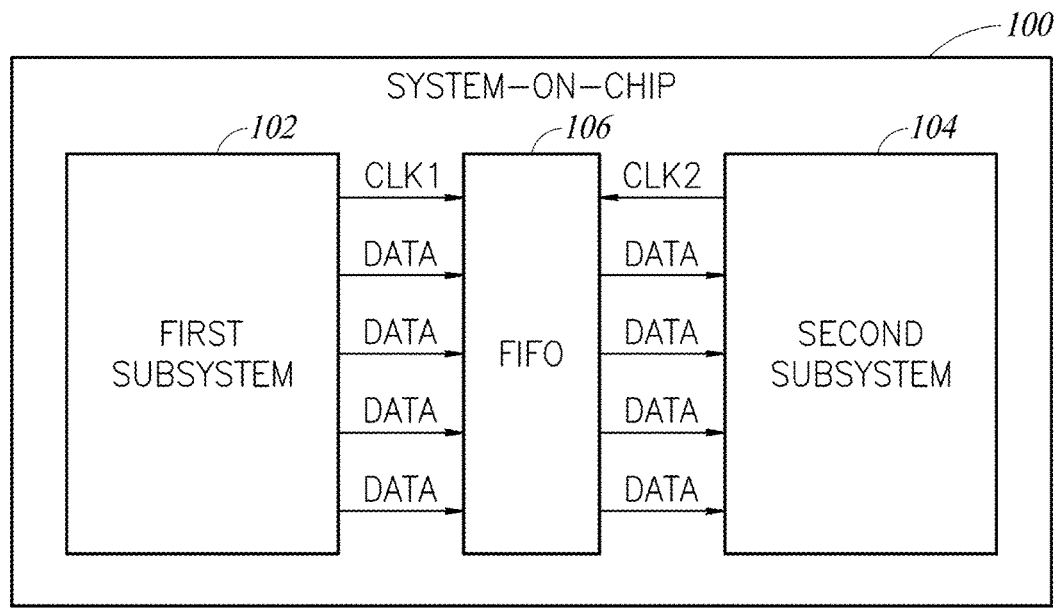
FIG. 1 is a schematic diagram of an integrated circuit including a first subsystem and a second subsystem.
Figure 2A:
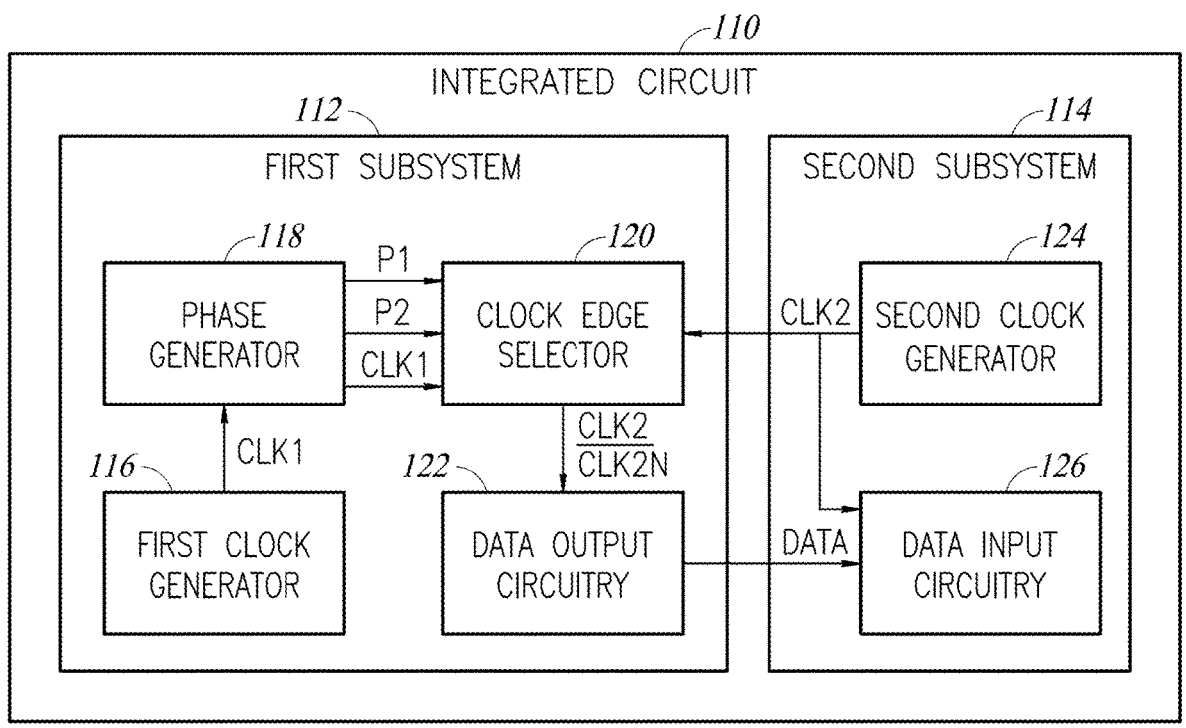
FIG. 2A is a schematic diagram of an integrated circuit including a first subsystem and a second subsystem, according to one embodiment.

FIG. 2A is a schematic diagram of an integrated circuit 110, according to one embodiment. The integrated circuit 110 includes a first subsystem 112 and the second subsystem 114. The first subsystem 112 transmits data to the second subsystem 114. As will be set forth in more detail below, the first subsystem 112 selects either a rising edge or falling edge of a clock signal for transmitting data to the second subsystem 114 based on phase differences between clock signals associated with the first subsystem 112 and the second subsystem 114.

The integrated circuit 110 is a system-on-a-chip (SoC). Accordingly, the integrated circuit 110 can include various subsystems such as analog-to-digital converters (ADC), digital-to-analog converters (DAC), microprocessors, memory, memory controllers, bus controllers, digital signal processors, low-voltage differential signaling (LVDS), wireless receivers, wireless transmitters, and other types of subsystems. Some of the subsystems provide data to other subsystems. Embodiments of the present disclosure help ensure that data can be transmitted effectively and efficiently from one subsystem to another. While FIG. 2A illustrates only a first subsystem 112 and a second subsystem 114, in practice, the integrated circuit 110 may include a large number of subsystems such as those described above, or others.

The first subsystem 112 includes a first clock generator 116. The first clock generator 116 generates a first clock signal CLK1. The first clock generator 116 can include a voltage control oscillator, a current control oscillator, a ring oscillator, or other types of oscillators that can generate a clock signal. The first clock generator 116 may generate a first clock signal CLK1 from the global clock signal of the integrated circuit 110. In this case, the integrated circuit 110 may include a global clock generator, such as a crystal oscillator or other type of clock generator, that generates the clock signal with a frequency on which the clock signals of the various subsystems are based. Accordingly, the first clock generator 116 may receive the global clock signal and generate CLK1 based on the global clock signal. The first clock signal CLK1 may have the same frequency as the global clock signal. The first clock signal CLK1 may be the global clock signal.

The first clock signal CLK1 is the clock signal on which the basic functions of the first subsystem 112 are performed. The block diagram of FIG. 2A only illustrates aspects of the first subsystem that are related to transmission of data to the second subsystem 114. In practice, the first subsystem 112 includes other circuitry associated with a primary function of the first subsystem. In an example in which the first subsystem 112 is an ADC, the first subsystem 112 would include circuitry that converts analog signals to digital signals under control of the first clock signal. For simplicity, such circuitry is not shown in FIG. 2A.

The second subsystem 114 includes a second clock generator 124. The second clock generator 124 generates a second clock signal CLK2. The second clock generator 124 can include a voltage control oscillator, a current control oscillator, a ring oscillator, or other types of oscillators that can generate a clock signal. The second clock generator 124 may generate a second clock signal CLK2 from the global clock signal of the integrated circuit 110 as described in relation to the generation of the first clock signal CLK1. The second clock generator 124 may receive the global clock signal and generate CLK2 based on the global clock signal. The second clock signal CLK2 may have the same frequency as the global clock signal. The second clock signal CLK2 may be the global clock signal.

In one embodiment, the first clock signal CLK1 and the second clock signal CLK2 have the same frequency. However, the first and second clock signals CLK1 and CLK2 are out of phase with each other. Initially, the phase difference between the first clock signal CLK1 and the second clock signal CLK2 may be unknown. The magnitude of the phase difference affects how data is transmitted from the first subsystem 112 and received by the second subsystem 114. If no action is taken based on the phase difference, then it is possible that clock cycles will be wasted between transmitting and receiving data due to delays associated with transmitting and receiving data. As will be set forth in more detail below, the first subsystem 112 detects the phase difference between CLK1 and CLK2 and adjusts data transmission based on the phase difference.

The first subsystem 112 includes a phase generator 118. The phase generator 118 receives the first clock signal CLK1 from the first clock generator 116. The phase generator 118 generates, from the first clock signal CLK1, a first phase signal P1 and a second phase signal P2. The first phase signal P1 and the second phase signal P2 are also clock signals having a same frequency as the first clock signal CLK1.

The phase generator 118 generates the first clock signal P1 with a first selected phase difference relative to the first clock signal CLK1. The phase generator 118 generates the second clock signal P2 with a second selected phase difference relative to the first clock signal CLK1. The first selected phase difference and the second selected phase difference define a timing window with respect to the rising edge of the first clock signal CLK1. The timing window corresponds to the time between the rising edge of the first phase signal P1 and the rising edge of the second phase signal P2. The rising edge of the first clock signal occurs after the rising edge of the first phase signal P1 and before the rising edge of the second phase signal P2. The basis on which the first selected phase difference and the second selected phase difference are selected as described in more detail below after basic description of other components of the first subsystem 112.

The phase generator 118 can include one or more phase locked loops (PLL) for generating the first and second phase signals P1 and P2 from the first clock signal CLK1. While the first clock generator 116 of the phase generator 118 is shown as distinct components, in practice, the first clock generator 116 and the phase generator 118 may be a single component. For example, the circuit that generates the first clock signal CLK1 may also generate the phase signals P1 and P2. The first clock generator 116 may be a circuit that receives the global clock signal, uses the global clock signal as the first clock signal CLK1, and generates the first and second phase signals P1 and P2 from the first clock signal CLK1.

The first subsystem 112 includes data output circuitry 122. The data output circuitry 122 outputs data to the second subsystem 114. In an example in which the first subsystem is an ADC, the data output circuitry 122 receives the digital data converted from analog signals and provides the digital data to the second subsystem 114.

The data output circuitry 122 includes a plurality of logic circuits that receive data of the first subsystem 112 and output the data to the second subsystem 114. There is delay associated with the logic circuits of the data output circuitry 122.

In one example, the data output circuitry 122 includes flip-flops that each include a clock terminal, a data input terminal, and a data output terminal. The data received at the input terminal will typically be provided to the output terminal upon the next rising edge of the clock signal received at the input terminal. However, there is a setup delay associated with the flip-flop. When data arrives at the input terminal of the flip-flop, there is a small setup time for the data to be fully received by the input terminal. If the rising edge of the clock signal occurs after data has arrived at the input terminal, but before the set up time has elapsed, then that data will not be passed to the output terminal of the flip-flop until the next rising edge of the clock signal. Accordingly, the setup time associated with the data input terminal is a source of signal transmission delay. Furthermore, there is an additional delay associated with passing data from the input terminal to the output terminal after the rising edge of the clock signal.

The second subsystem 114 includes data input circuitry 126. The data input circuitry 126 receives data from the data output circuitry 122 of the first subsystem 112. The data input circuitry 126 also includes logic circuits that receive and process the data from the data output circuitry 122 of the first subsystem 112. There are delays associated with the logic circuits of the data input circuitry 126.

In one example, the logic circuits of the data input circuitry 126 include a plurality of flip-flops. As described previously in relation to flip-flops of the data output circuitry 122, there are delays associated with receiving data at input terminals of the flip-flops of the data input circuitry. In particular, the setup delay described previously is also a factor in the flip-flops of the data output circuitry 126. If the rising edge of the second clock signal is received at the clock terminal of the flip-flop after data arrives at the input terminal of the flip-flop but before the set up time associated with the data input terminal has elapsed, then the data value will not be passed to the flip-flop until the next rising edge of the clock signal. Accordingly, an entire clock signal can be lost if the clock signals that control the flip-flops of both the data output circuitry 122 and the data input circuitry 126 are not carefully managed.

Returning to the data output circuitry, 122 of the first subsystem 112, data is provided to the data output circuitry 122 in accordance with the first clock signal CLK1. In the example in which the first subsystem 112 is an ADC, the analog-to-digital conversion happens in accordance with the first clock signal CLK1. Accordingly, digital data is passed to the data output circuitry 122 in accordance with the first clock signal. This means that data will arrive at the input terminals of the flip-flops of the data output circuitry 122 in accordance with the rising edge of the first clock signal.

However, the clock signal that is provided to the flip-flops of the data output circuitry 122 is the second clock signal CLK2 (or the logical compliment of CLK2, as will be explained in further detail below). Thus, data arrives at the input terminals of the flip-flops of the data output circuitry 122 based on the rising edge of the first clock signal CLK1, but data is passed from the input terminals of the flip-flops to the output terminals of the flip-flops based on the second clock signal CLK2. Due to the delays associated with the data output circuitry 122 and the data input circuitry 126 as described above, if the rising edge of the second clock signal CLK2 occurs too close to the rising edge of the first clock signal CLK1, the data will not be received and processed at the data input circuitry 126 within the same cycle of the second clock signal, assuming that the flip-flops of the data input circuitry 122 are managed by the rising edge of the second clock signal.

Advantageously, the first subsystem 112 utilizes the clock edge selector 120 to determine whether the rising edge of the second clock signal is too close to the rising edge of the first clock signal. If the rising edge of the second clock signal is too close to the rising edge of the first clock signal, then the clock edge selector 120 selects the falling edge of the second clock signal to control the flip-flops of the data output circuitry 122. The clock edge selector 120 receives the second clock signal CLK2 from the second subsystem 114. The clock edge selector 120 also receives the first clock signal CLK1, the first phase signal P1, and the second phase signal P2 from the phase generator 118. As described previously, the time between the rising edge of P1 and the rising edge of P2 defines a timing window, with the rising edge of CLK1 occurring during the timing window. If the rising edge of CLK2 occurs within the timing window, then the clock edge selector 120 selects the falling edge of CLK2 for managing the flip-flops of the data output circuitry 122. If the rising edge of CLK2 occurs outside the timing window, then the clock edge selector 120 selects the rising edge of CLK2 for controlling the flip-flops of the data output circuitry 122. Other criteria can be used to select the rising edge or falling edge of the second clock signal CLK2 without departing from the scope of the present disclosure.

In one embodiment, the clock edge selector 120 receives the second clock signal CLK2 and generates the complementary second clock signal CLK2N. CLK2N is the logical complement of CLK2. CLK2N has the same frequency as CLK2. When CLK2 is high, CLK2N is low. When CLK2 is low, CLK2N is high. When the clock edge selector 120 determines that the rising edge of CLK2 should manage the data output circuitry 122, the clock edge selector 120 provides CLK2 to the data output circuitry 122. When the clock edge selector 120 determines that the falling edge of CLK2 should manage the data output circuitry 122, the clock edge selector 120 provides CLK2N to the data output circuitry. Because the rising edge of CLK2N occurs at the falling edge of CLK2, providing CLK2N to the data output circuitry 122 corresponds to managing the data output circuitry 122 with the falling edge of CLK2. As described previously, the flip-flops of the data output circuitry 122 cause data to be transferred from the input terminal to the output terminal upon the rising edge of the clock signal received by the flip-flops. Accordingly, if the flip-flops receive CLK2N as the clock signal, the rising edge of CLK2N controls the flip-flops. Because CLK2N is the logical complement of CLK, this corresponds to the falling edge of CLK2 controlling the flip-flops of the data output circuitry 122.

Figure 2B:
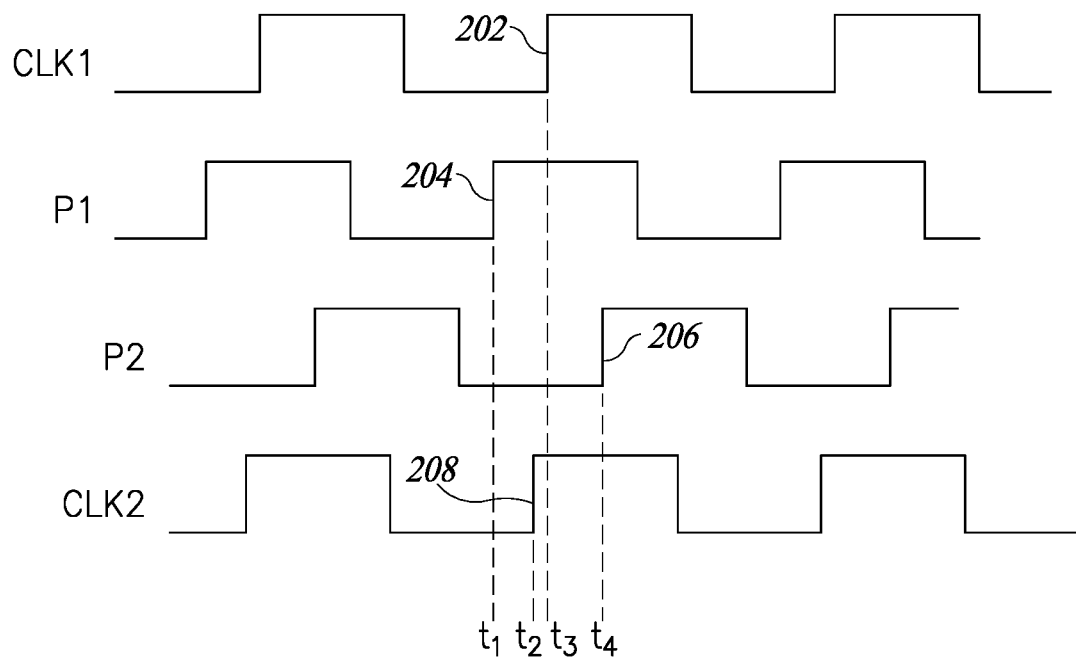
FIGS. 2B and 2C are timing diagrams of signals associated with the first and second subsystems, according to one embodiment.

FIG. 2B is a timing diagram illustrating principles of the clock edge selector, according to one embodiment. FIG. 2B illustrates CLK1, P1, P2, and CLK2. Each of these clock signals has the same frequency. FIG. 2B also illustrates points of timing interest t1, t2, t3, and t4. At time t1, the rising edge 204 of the phase signal P1 occurs. At time t3, a rising edge of the clock signal 202 occurs. At time t4, a rising edge 206 of the phase signal P2 occurs. The period of time between the rising edge 204 of P1 and the rising edge 206 of P2 corresponds to the timing window used to determine whether the rising edge or the falling edge of CLK2 will control the data output circuitry 122.

The rising edge 204 of P1 occurs a length of time t3–t1 before the rising edge 202 of CLK 1. This length of time is selected based on the various delays associated with the data output circuitry 122 and the data input circuitry 126. The rising edge 206 of P2 occurs in length of time t4–t3 after the rising edge 202 of CLK1. This length of time is selected based on the various delays associated with the data output circuitry 122 and the data input circuitry 126. As described previously, if the rising edge of CLK2 occurs too close to the rising edge 202 of CLK1, then data will not be processed within the data input circuitry 126 until after the next cycle of CLK2 if the data input circuitry 122 is managed by the rising edge of CLK2. The timing window t4–t1 defines the period of time during which if a rising edge of CLK2 occurs, then the falling edge of CLK2 should be used to control the data output circuitry 122.

In FIG. 2B, the rising edge 208 of CLK2 occurs at time t2. This is within the timing window t4–t1. Accordingly, in this case, the clock edge selector 120 will select the falling edge of CLK2 to control the data output circuitry 122. This means that the clock edge selector 120 will output CLK2N to the data output circuitry 122.

Figure 2C:
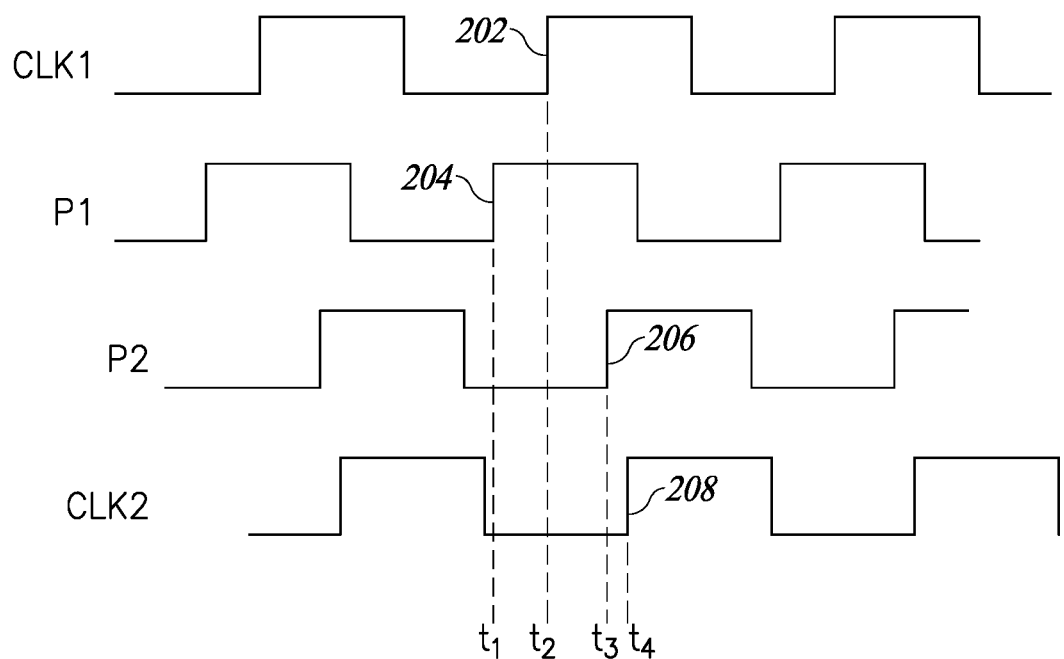

FIG. 2C is a timing diagram of signals associated with the clock edge selector 120, according to one embodiment. In FIG. 2C, the signals CLK1, P1, and P2 are the same as they were in FIG. 2B. However, in FIG. 2C the phase of CLK2 is different than in FIG. 2B for the sake of providing an additional example. In FIG. 2C, the time t1 corresponds to the rising edge 204 of P1, t2 corresponds to the rising edge 202 of CLK1, t3 corresponds to the rising edge 206 of P2. t4 corresponds to the rising edge 208 of CLK2. In FIG. 2C, the timing window corresponds to t1–t3, which is the same length of time as t1–t4 in FIG. 2B.

In FIG. 2C, the rising edge 208 of CLK2 occurs outside the timing window defined by the rising edges 204 and 208 of P1 and P2. This means that the rising edge of CLK2 is far enough away from the rising edge 202 of CLK1 that the rising edge of CLK2 can be used to control the data output circuitry 122. Accordingly, the clock edge selector 120 will supply CLK2 as the clock signal to control the data output circuitry 122. In one example, this means that the clock edge selector 120 will supply CLK2 to the clock terminals of the flip-flops of the data output circuitry 122.

In one embodiment, if the clock edge selector 120 detects either a rising edge or falling edge of CLK2 within the timing window defined by P1 and P2, then the clock edge selector 120 will supply CLK2N to the data output circuitry 122.

Figure 3:
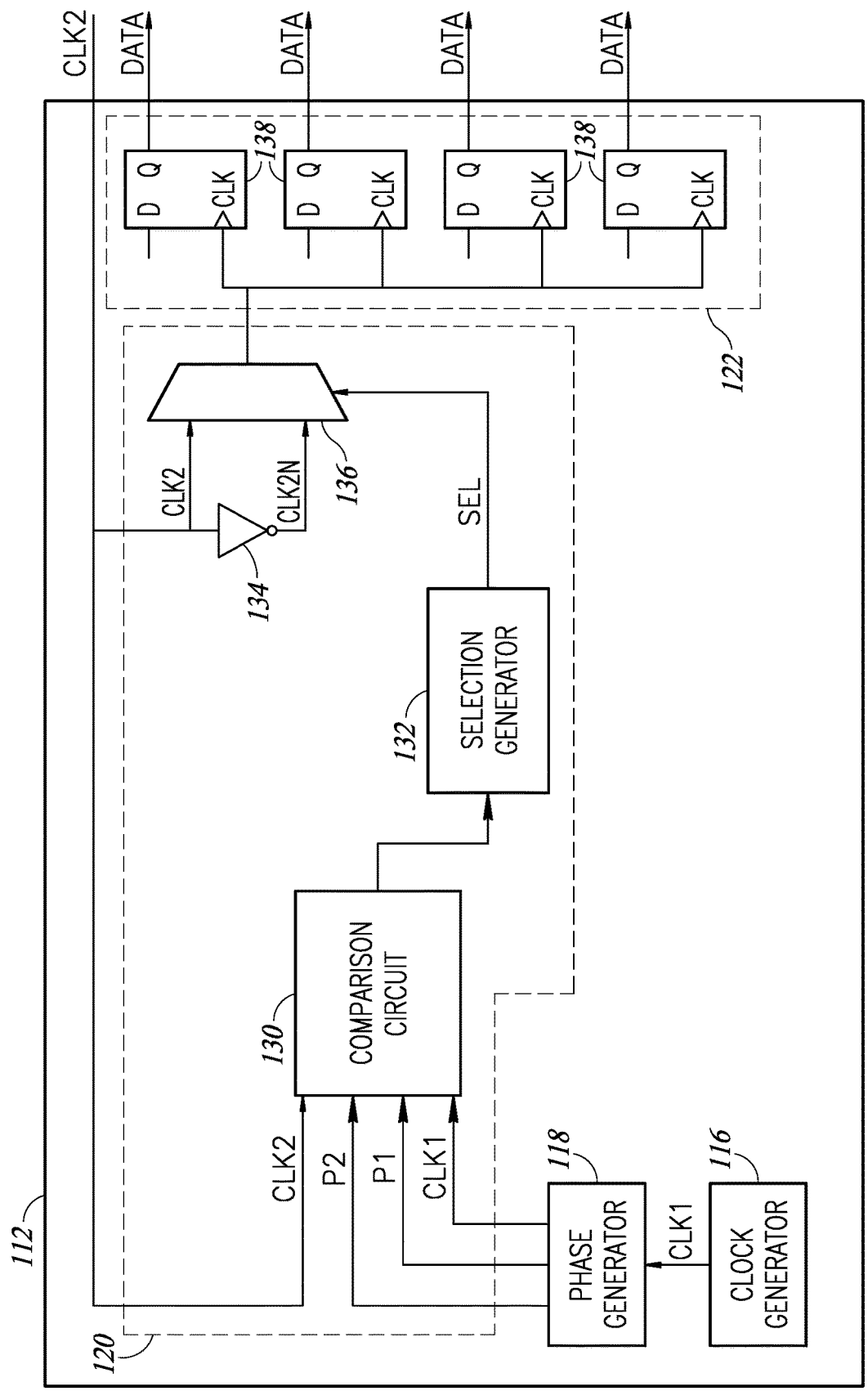
FIG. 3 is a schematic diagram of a first subsystem of an integrated circuit, according to one embodiment.

FIG. 3 is a schematic diagram of a first subsystem 112 of an integrated circuit, according to one embodiment. The first subsystem 112 of FIG. 3 is one example of a first subsystem 112 of FIG. 2. The first subsystem 112 includes the clock generator 116, the phase generator 118, the clock edge selector 120, and the data output circuitry 120. The clock generator 116 generates the first clock signal CLK1 as described previously. The phase generator 118 generates the phase signals P1 and P2 from the first clock signal CLK1, as described previously.

The clock edge selector 120 includes a comparison circuit 130. The comparison circuit 130 receives the first clock signal CLK1, the phase signal P1, and the phase signal P2. The comparison circuit 130 also receives the second clock signal CLK2N from the second subsystem 114. The comparison circuit 130 performs the comparisons to determine if the rising edge of CLK2 occurs within the timing window defined by the rising edges of P1 and P2 with the rising edge of CLK1 occurring after P1 and before P2. The comparison circuit 130 outputs a data signal, or plurality of data signals indicating whether the rising edge of CLK2 occurs within the timing window.

In one embodiment, the comparison circuit 130 outputs a binary data value for each of the signals P1, P2, CLK1, and CLK2. If a value of 1 corresponds to a high signal and a value of 0 corresponds to a low signal, then the timing window corresponds to the period of time during which P1 has a value of 1 and P0 has a value of 0. If the value of CLK2 transitions from 0 to 1 at any point during this period of time, then the selection generator 132 outputs a selection signal SEL indicating that the falling edge of CLK2 should control the data output circuitry 120. If the value CLK2 is 0 for the entirety of the timing window or 1 for the entirety of the timing window, then the selection generator 132 outputs the selection signal SEL indicating that CLK2 should be provided to the data output circuitry 120. Many schemes can be utilized for detecting whether the rising edge of CLK2 occurs within the timing window, without departing from the scope of the present disclosure. Furthermore, as described previously, in some embodiments if either the rising or falling edge of CLK2 occurs within the timing window, then CLK2N can be provided to the data output circuitry 122.

The clock edge selector 120 also includes an inverter 134 and a multiplexer 136. The input of the inverter 134 is the second clock signal CLK2. The output of the inverter 134 is supplied to one of the inputs of the multiplexer 136. The output of the inverter 134 is the complementary second clock signal CLK2N. The other input of the multiplexer 136 receives the second clock signal CLK2. The multiplexer 136 also includes a control terminal that determines which of the two inputs will be provided to the output. The control terminal receives the selection signal SEL from the selection generator 132. The value of the selection signal SEL from the comparison circuit 130 determines whether or not the multiplexer will output CLK2 or CLK2N.

The data output circuitry 122 includes a plurality of flip-flops 138. The flip-flops each include a data input terminal D, a data output terminal Q, and a clock input terminal CLK. The data input terminal D receives data from primary circuitry (not shown) of the subsystem 112. In an example in which the subsystem 112 is an analog-to-digital converter, the data input terminals D receive data from the analog-to-digital conversion circuitry that is controlled by the first clock signal CLK1.

The clock input terminal CLK of each flip-flop is connected to the output of the multiplexer 136. Accordingly, the flip-flops 138 receive either CLK2 or CLK2N on the clock input terminals CLK, depending on the value of the selection signal SEL. For each flip-flop 138, whatever data value is present at D will be provided to the output terminal Q when the clock terminal CLK goes high, subject to set up delays as described previously. If the multiplexer 136 outputs CLK2, then the rising edge of CLK2 controls the flip-flops 138. If the multiplexer 136 outputs CLK2N, then the falling edge of CLK2 controls the flip-flops 138. This is because the rising edge of CLK2N controls the flip-flops 138. The rising edge of CLK2N corresponds to the falling edge of CLK2 because CLK2N is the logical complement of CLK2 based on the function of the inverter 134. The data output terminals Q are connected to the data input terminals of flip-flops of the data input circuitry 126 of the second subsystem 114.

Figure 4:
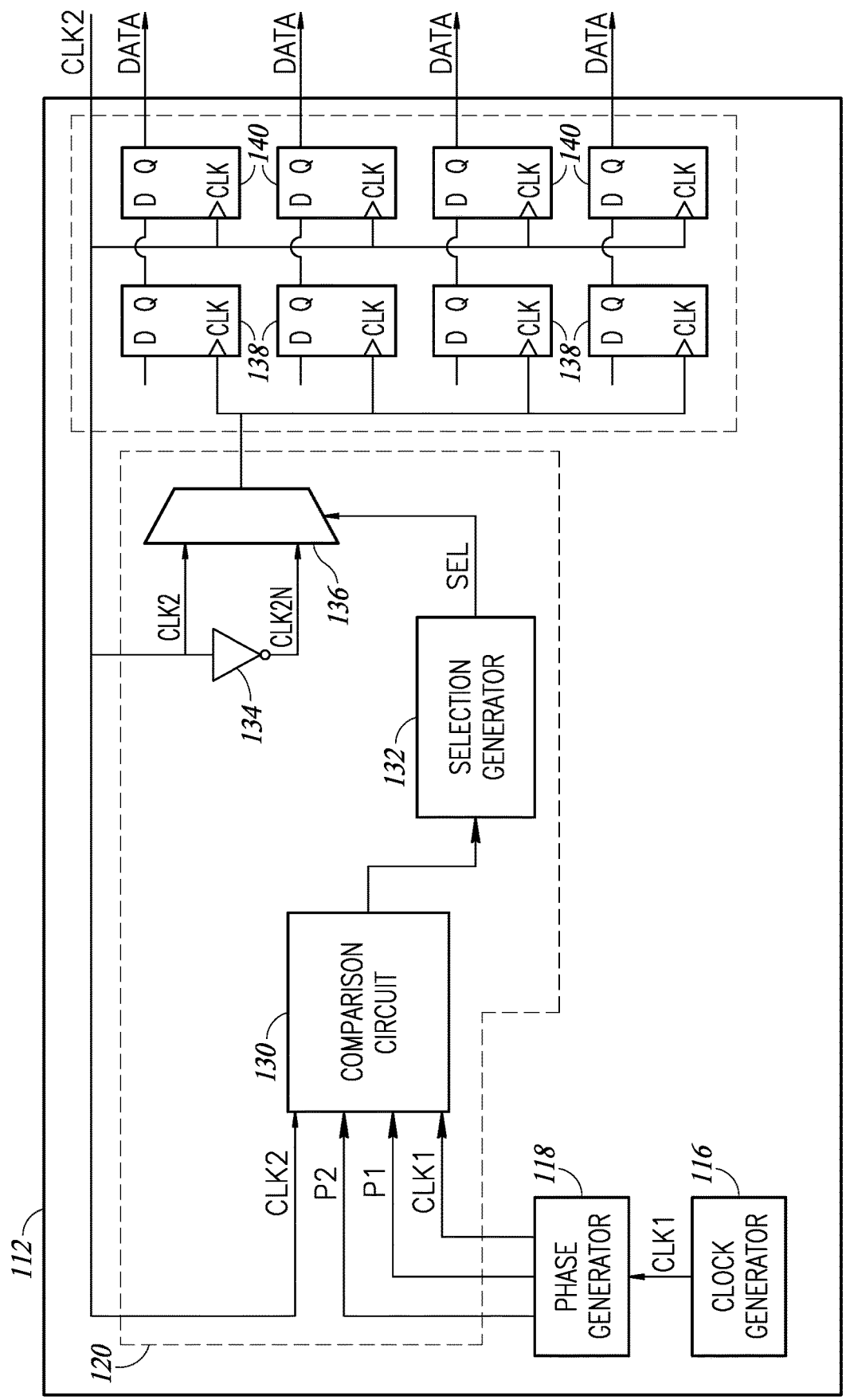
FIG. 4 is a schematic diagram of a first subsystem of an integrated circuit, according to one embodiment.

FIG. 4 is a schematic diagram of a first subsystem 112, according to one embodiment. The first subsystem 112 of FIG. 4 is substantially similar to the first subsystem 112 of FIG. 3, except that the subsystem 112 of FIG. 4 includes flip-flops 140. The flip-flops 140 may be called shadow flip-flops. The data input terminal D of each flip-flop 140 receives data from a data output terminal Q of a corresponding flip-flop 138. The flip-flops 140 each receive the second clock signal CLK2 on the clock input terminal CLK.

In FIG. 4, the flip-flops 138 are selectively controlled by either the rising edge of the falling edge of CLK2 and output data to the flip-flops 140. The flip-flops 140 are controlled by the rising edge of CLK2. The flip-flops 140 output data to the corresponding flip-flops of the data input circuitry 126 of the second subsystem 114.

Figure 5:
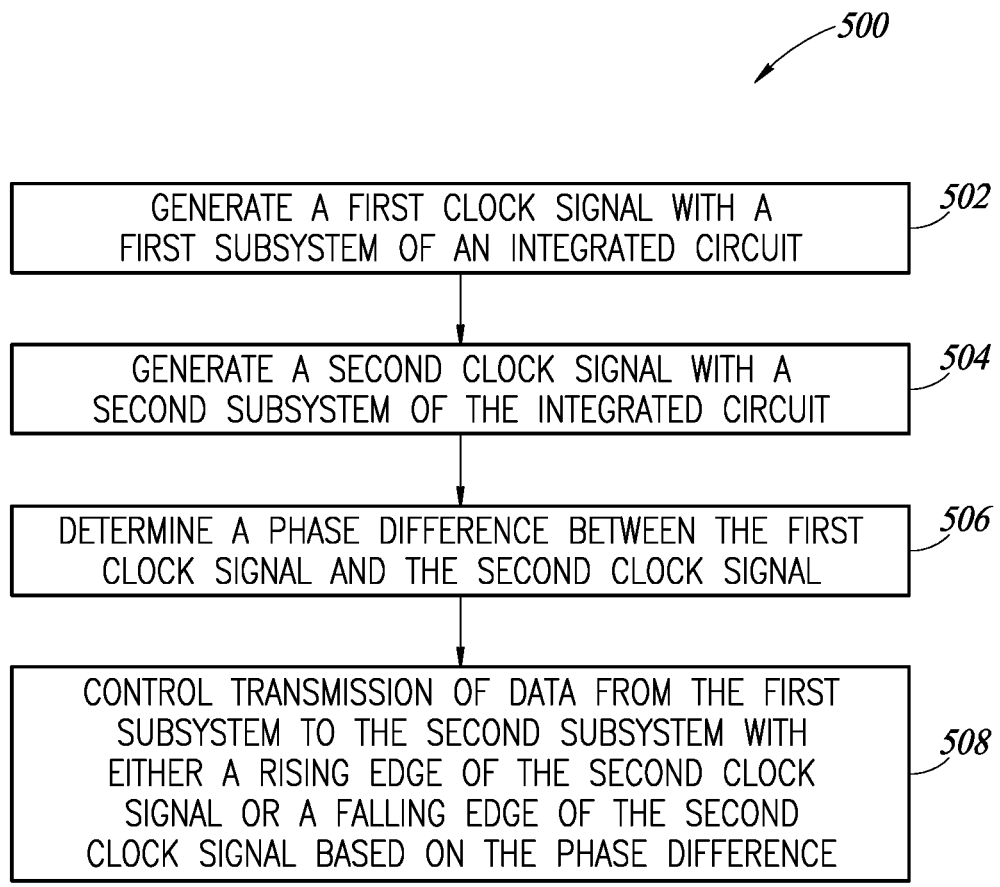
FIG. 5 is a flow diagram of a method of operating an integrated circuit, according to one embodiment.

FIG. 5 is a flow diagram of a method 500 for operating an integrated circuit, according to one embodiment. At 502, the method 500 includes generating a first clock signal with a first subsystem of an integrated circuit. At 504, the method 500 includes generating a second clock signal with a second subsystem of the integrated circuit. At 506, the method 500 includes determining a phase difference between the first clock signal and the second clock signal. At 508, the method 500 includes controlling transmission of data from the first subsystem to the second subsystem with either a rising edge of the second clock signal or a falling edge of the second clock signal based on the phase difference.

Figure 6:
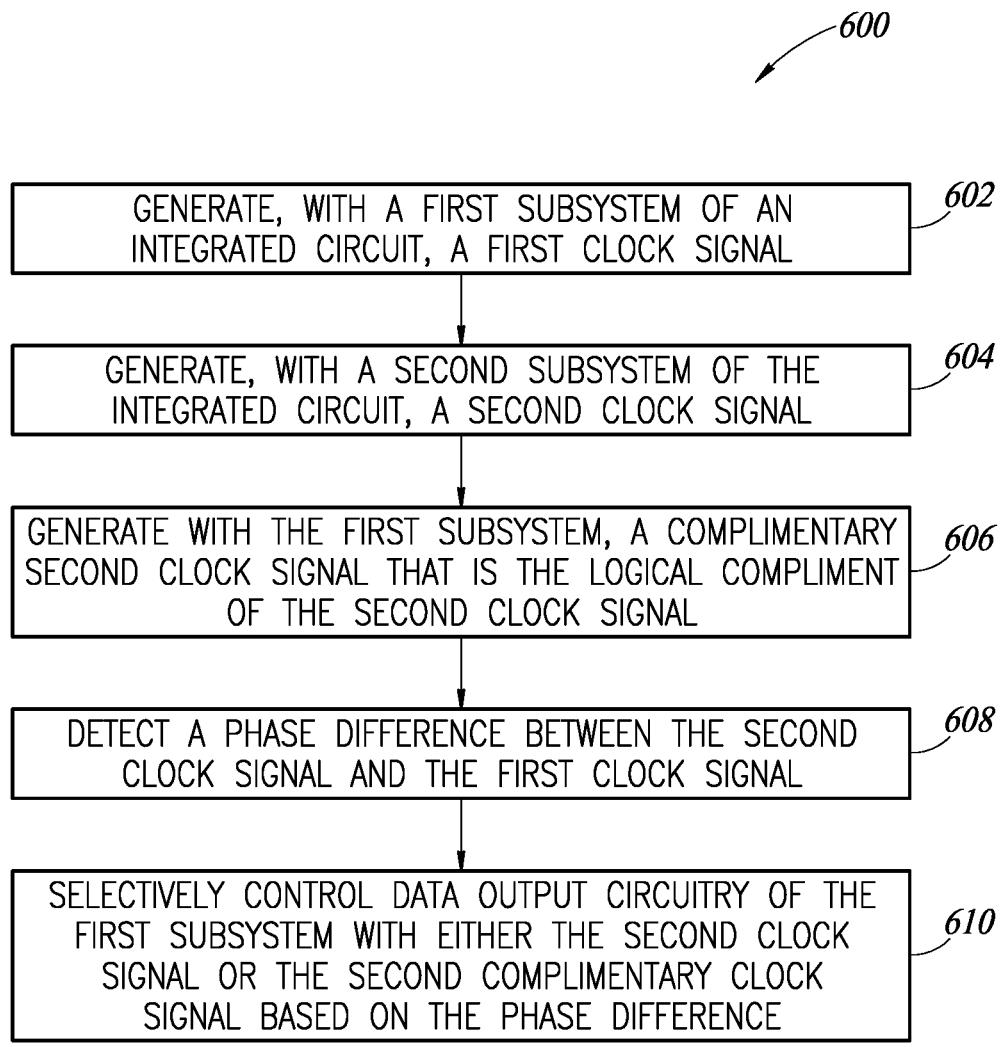
FIG. 6 is a flow diagram of a method of operating an integrated circuit, according to one embodiment.

FIG. 6 is a flow diagram of a method 600 for controlling an integrated circuit, according to one embodiment. At 602, the method 600 includes generating, with a first subsystem of an integrated circuit, a first clock signal. At 604, the method 600 includes generating, with a second subsystem of the integrated circuit, a second clock signal. At 606, the method 600 includes generating with the first subsystem, a complimentary second clock signal that is the logical compliment of the second clock signal. At 608, the method 600 includes detecting a phase difference between the second clock signal and the first clock signal. At 610, the method 600 includes selectively controlling data output circuitry of the first subsystem with either the second clock signal or the second complimentary clock signal based on the phase difference.

In one embodiment, a method includes generating a first clock signal with a first subsystem of an integrated circuit and generating a second clock signal with a second subsystem of the integrated circuit. The method includes determining a phase difference between the first clock signal and the second clock signal and controlling transmission of data from the first subsystem to the second subsystem with either a rising edge of the second clock signal or a falling edge of the second clock signal based on the phase difference.

In one embodiment, an integrated circuit includes a first subsystem including a first clock generator configured to generate first clock signal and a clock edge selector coupled to the first clock generator. The integrated circuit includes a second subsystem including a second clock generator configured to generate a second clock signal. The clock edge selector is configured to determine a phase difference between the first clock signal and the second clock signal and to select, based on the phase difference, either a rising edge or a falling edge of the second clock signal to control output of data from the first subsystem to the second subsystem.

In one embodiment, a method includes generating, with a first subsystem of an integrated circuit, a first clock signal, generating, with a second subsystem of the integrated circuit, a second clock signal, and generating with the first subsystem, a complimentary second clock signal that is the logical compliment of the second clock signal. The method includes detecting a phase difference between the second clock signal and the first clock signal and selectively controlling data output circuitry of the first subsystem with either the second clock signal or the second complimentary clock signal based on the phase difference.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A method, comprising:
generating a first clock signal with a first subsystem of an integrated circuit;
generating a second clock signal with a second subsystem of the integrated circuit;
determining a phase difference between the first clock signal and the second clock signal; and
selecting an edge of the second clock signal based on the phase difference;
controlling transmission of data from the first subsystem to the second subsystem with the selected edge of the second clock signal;

generating, with the first subsystem, a first phase signal having a same frequency as the first clock signal and a first selected phase difference relative to the first clock signal; and generating, with the first subsystem, a second phase signal having the same frequency as the first clock signal and a second selected phase difference relative to the first clock signal.

2. The method of claim 1, further comprising determining the phase difference by identifying whether a rising edge of the second clock signal occurs between a rising edge of the first phase signal and a rising edge of the second phase signal.

3. The method of claim 2, further comprising determining the phase difference by identifying whether the rising edge of the second clock signal and a rising edge of the first clock signal occur between the rising edge of the first phase signal and the rising edge of the second phase signal.

4. The method of claim 3, further comprising controlling transmission with the rising edge of the second clock signal if the rising edge of the second clock signal does not occur between the rising edge of the first phase signal and the rising edge of the second phase signal.

5. The method of claim 4, wherein controlling transmission of data with the rising edge of the second clock signal includes providing the second clock signal to clock input terminals of flip-flops of the first subsystem.

6. The method of claim 4, further comprising controlling transmission with a falling edge of the second clock signal if the rising edge of the second clock signal occurs between the rising edge of the first phase signal and the rising edge of the second phase signal.

7. The method of claim 6, wherein controlling transmission of data with the rising edge of the second clock signal includes providing a complimentary second clock signal to clock input terminals of flip-flops of the first subsystem, wherein the complimentary second clock signal is a logical compliment of the second clock signal.

8. The method of claim 7, wherein generating the complimentary second clock signal includes providing the second clock signal to an inverter.

9. The method of claim 7, further comprising providing the second clock signal and the complimentary second clock signal to a multiplexer.

10. The method of claim 9, wherein selectively controlling transmission of data includes outputting either the second clock signal or the complimentary second clock signal from the multiplexer.

11. An integrated circuit, comprising:
a first subsystem including:
a first clock generator configured to generate first clock signal;
a clock edge selector coupled to the first clock generator;
a phase generator configured to generate, from the first clock signal, a first phase signal having a first selected phase difference with the first clock signal and a second phase signal having a second selected phase difference with the first clock signal; and
a second subsystem including:
a second clock generator configured to generate a second clock signal, the clock edge selector is configured to determine a phase difference between the first clock signal and the second clock signal and to select, based on the phase difference, either a rising edge or a falling edge of the second clock signal to control output of data from the first subsystem to the second subsystem.

12. The integrated circuit of claim 11, wherein the clock edge selector determines the phase difference by comparing the second clock signal to the first and second phase signals.

13. The integrated circuit of claim 11, further comprising a plurality of flip-flops coupled to the clock edge selector, wherein the clock edge selector is configured to invert the second clock signal to generate a complimentary second clock signal, wherein the clock edge selector is configured to provide to the flip-flops either the second clock signal or the complimentary second clock signal based on the phase difference.

14. A method, comprising:
generating, with a first subsystem of an integrated circuit, a first clock signal;
generating, with a second subsystem of the integrated circuit, a second clock signal;
generating with the first subsystem, a complimentary second clock signal that is a logical compliment of the second clock signal;
detecting a phase difference between the second clock signal and the first clock signal;
selectively controlling data output circuitry of the first subsystem with either the second clock signal or the complimentary second clock signal based on the phase difference, wherein selectively controlling data output circuitry includes selectively providing either the second clock signal or the complimentary second clock signal to clock terminals of first flip-flops of the first subsystem based on the phase difference;
passing data from the first flip-flops to second flip-flops of the first subsystem; and
providing the second clock signal to clock terminals of the second flip-flops.

15. The method of claim 14, further comprising passing the data from the second flip-flops to the second subsystem.

16. The method of claim 15, further comprising:
receiving the data with data input circuitry of the second subsystem; and
controlling the data input circuitry with the second clock signal.

* * * * *